United States Patent
Guo et al.

(10) Patent No.: US 11,037,900 B2
(45) Date of Patent: *Jun. 15, 2021

(54) CHIP BONDING DEVICE AND BONDING METHOD THEREOF

(71) Applicant: SHANGHAI MICRO ELECTRONICS EQUIPMENT (GROUP) CO., LTD., Shanghai (CN)

(72) Inventors: Song Guo, Shanghai (CN); Jianqi Sun, Shanghai (CN); Feibiao Chen, Shanghai (CN); Yuebin Zhu, Shanghai (CN); Tianming Wang, Shanghai (CN); Hai Xia, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 161 days.

This patent is subject to a terminal disclaimer.

(21) Appl. No.: 16/312,834

(22) PCT Filed: Jun. 22, 2017

(86) PCT No.: PCT/CN2017/089505
§ 371 (c)(1),
(2) Date: Dec. 21, 2018

(87) PCT Pub. No.: WO2017/219997
PCT Pub. Date: Dec. 28, 2017

(65) Prior Publication Data
US 2019/0164930 A1     May 30, 2019

(30) Foreign Application Priority Data
Jun. 23, 2016 (CN) .......................... 201610470114.1

(51) Int. Cl.
*H01L 21/677* (2006.01)
*H01L 23/00* (2006.01)
(Continued)

(52) U.S. Cl.
CPC .......... *H01L 24/75* (2013.01); *H01L 21/6773* (2013.01); *H01L 21/67092* (2013.01);
(Continued)

(58) Field of Classification Search
CPC .................................................... H01L 21/681
See application file for complete search history.

(56) References Cited

U.S. PATENT DOCUMENTS 9,570,417 B2 * 2/2017 Jeong ...................... H01L 24/83
2005/0081986 A1 * 4/2005 Kwon ..................... H01L 24/27
156/249

FOREIGN PATENT DOCUMENTS

CN        201522998 U     7/2010
CN        103367208 A     10/2013
(Continued)

*Primary Examiner* — Yu-Hsi D Sun
(74) *Attorney, Agent, or Firm* — Muncy, Geissler, Olds & Lowe, P.C.

(57) ABSTRACT

A chip bonding apparatus and method are disclosed. The chip bonding apparatus includes: at least one separation module for separating chips; at least one bonding module for bonding the chips a substrate; a transportation device for transporting the chips between the separation module and the bonding module, the transportation device including one or more guide tracks and one or more transportation carriers for retaining the chips, each of the guide tracks is provided thereon with at least one of the transportation carriers; and a control device for individually controlling the separation module, the bonding module and the transportation device. The chip bonding apparatus and method allows pickup, transportation and chip-to-substrate bonding of chips in
(Continued)

batches with increased chip bonding yield and improved chip bonding accuracy.

19 Claims, 6 Drawing Sheets

(51) Int. Cl.
    *H01L 21/67*     (2006.01)
    *H01L 21/68*     (2006.01)
    *H01L 21/687*     (2006.01)

(52) U.S. Cl.
    CPC .. *H01L 21/67144* (2013.01); *H01L 21/67173* (2013.01); *H01L 21/67178* (2013.01); *H01L 21/67721* (2013.01); *H01L 21/67736* (2013.01); *H01L 21/68* (2013.01); *H01L 21/68707* (2013.01); *H01L 24/80* (2013.01); *H01L 24/97* (2013.01); *H01L 2224/7598* (2013.01)

(56) References Cited

FOREIGN PATENT DOCUMENTS

| | | | |
|---|---|---|---|
| CN | 103576467 | A | 2/2014 |
| CN | 104183527 | A | 12/2014 |
| CN | 104183528 | A | 12/2014 |
| CN | 104701199 | A | 6/2015 |
| CN | 105531809 | A | 4/2016 |
| JP | 2000164640 | A | 6/2000 |
| JP | 2000294603 | A | 10/2000 |
| JP | 2003273167 | A | 9/2003 |
| JP | 2007158051 | A | 6/2007 |
| JP | 2010135574 | A | 6/2010 |
| KR | 101446170 | B1 | 10/2014 |

* cited by examiner

CHIP BONDING DEVICE AND BONDING METHOD THEREOF

TECHNICAL FIELD

The present invention relates to a chip bonding apparatus and bonding method thereof.

BACKGROUND

Flip-chip bonding is an interconnection approach for bonding chips to a substrate. With the development of electronics toward light weight, slimness and miniaturization, chip bonding techniques are gaining increasing use. When combined with a wafer-level packaging process, a chip bonding process allows the fabrication of smaller packages with higher performance. Moreover, a chip bonding process in combination with a through-silicon via (TSV) process makes it possible to manufacture three-dimensional structures that are more competitive in terms of cost and performance.

Limited by existing chip bonding apparatuses, a conventional flip-chip bonding process typically involves picking up a single chip from a chip source with a suction head sized comparably to the chip. After aligning an alignment mark on the chip with an alignment mark on the substrate to which the chip is to be bonded with the aid of an alignment system, the chip is directly pressed down onto the substrate to form an interconnection therebetween. The conventional flip-chip bonding process is a serial transportation and bonding process, and therefore the time for the entire chip bonding process is extended, especially for the press bonding cycle which individually lasts for a long time. The overall yield of the chip bonding will be too low to meet the requirements for mass production. In addition, the bonding accuracy of this process is low.

In view of the above problems, there is a need for a novel chip bonding apparatus and bonding method thereof.

SUMMARY OF THE INVENTION

The technical problem to be solved by the present invention to provide a chip bonding apparatus and method allowing pickup, transportation and chip-to-substrate bonding of chips in batches with increased chip bonding yield and improved chip bonding accuracy.

To solve the above technical problem, the chip bonding apparatus provided in the present invention includes:
- at least one separation module for separating chips;
- at least one bonding module for bonding the chips to a substrate;
- a transportation device for transporting the chips between the separation module and the bonding module, the transportation device including one or more guide tracks and one or more transportation carriers for retaining the chips, each of the guide tracks provided thereon with at least one of the transportation carriers; and
- a control device for individually controlling the separation module, the bonding module and the transportation device.

Further, the chip bonding apparatus may further include at least one fine-adjustment module for finely adjusting the positions of the chips carried on the transportation carrier, wherein the transportation device is configured to transport the chips among the separation module, the fine-adjustment module and the bonding module, and wherein the control device is further configured to control the fine-adjustment module.

Further, the transportation device may include a plurality of guide tracks extending in a direction along which a separation area, a fine-adjustment area and a bonding area are defined.

Further, each of the transportation carriers may include a carrier plate and an alignment system, the carrier plate configured to carry the chip, the alignment system configured to detect a position of the chip to be separated as well as a mark on the substrate.

Optionally, the guide tracks may be linear guide tracks, the separation module moves within the separation area among the plurality of guide tracks, the fine-adjustment module moves within the fine-adjustment area among the plurality of guide tracks, and the bonding module moves within the bonding area among the plurality of guide tracks.

Further, each of the linear guides may be provided thereon with one of the transportation carriers, the control device controlling the transportation carriers to move forth and back on the linear guide tracks, such that the transportation carriers on at least two of the linear guide tracks are located within different ones of the separation area, the fine-adjustment area and the bonding area and operate in cooperation with the corresponding ones of the separation module, the fine-adjustment module and the bonding module.

Optionally, the transportation device may include two guide tracks which are connected end to end to form an annular guide track.

Further, a number of transportation carriers may be provided on the annular guide track, the control device controlling the transportation carriers to move orderly on the annular guide track, such that at least two of the transportation carriers are located within different ones of the separation area, the fine-adjustment area and the bonding area and operate in cooperation with the corresponding ones of the separation module, the fine-adjustment module and the bonding module.

Optionally, at least one shunt loop may be provided on the annular guide track, each shunt loop corresponding to one of the at least one separation module, one of the at least one fine-adjustment module or one of the at least one bonding module.

Optionally, operations performed by the separation module, the fine-adjustment module and the bonding module may last for durations of a, b and c seconds, respectively, wherein letting d represent the least common multiple of 1, m and n, which are rounded results of 3600/a, 3600/b and 3600/c, respectively, numbers of the at least one separation module, the at least one fine-adjustment module and the at least one bonding module are set as d/a, d/b and d/c, respectively.

Optionally, the separation module may include: a separation table for supporting the chips; a flipping robotic arm for picking up and flipping the chips; and a separation mechanism which is disposed in the separation table and is configured to separate the chips.

Further, the separation mechanism may include, from the top downward, a separation pin, a suction member and a horizontal mover, the separation pin and the suction member both fixed on the horizontal mover, the horizontal mover having two degrees of freedom of movement in a first direction and a second direction, the separation pin movable having one degree of freedom of movement in a third direction, the first, second and third directions perpendicular to one another.

Further, the flipping robotic arm may have three degrees of freedom of movement in a first direction, a second direction and a third direction and one degree of freedom of rotation, the first, second and third directions perpendicular to one another.

Further, the fine-adjustment module may include a fine-adjustment table as well as an alignment system and a pin disposed on the fine-adjustment table, the alignment system configured to detect the positions of the chips, the pin configured to adjust the positions of the chips.

Further, the bonding module may include: a bonding table for supporting the substrate; and an alignment system for detecting the positions of the chips.

Optionally, the bonding table may have three degrees of freedom of movement in a first direction, a second direction and a third direction, the first, second and third directions perpendicular to one another.

Optionally, the bonding table may have two degrees of freedom of movement in a first direction and a second direction, wherein a presser is disposed on the bonding table and has one degree of freedom of movement in a third direction, and wherein the first, second and third directions are perpendicular to one another.

Further, the chip bonding apparatus may further include a first material pick-up module for storing chips and a second material pick-up module for storing substrates, the first material pick-up module including: a carrier cassette containing a plurality of carriers; and a first robotic arm for picking up and transporting the carriers, each carrier bearing a number of the chips, the second material pick-up module including: a substrate cassette for storing substrates; and a second robotic arm for picking up and transporting the substrates.

According to another aspect, the present invention provides a chip bonding method using the chip bonding apparatus as defined above. The chip bonding method includes:

picking up and separating chips by a separation module and carrying the separated chip by a transportation carrier of a transportation device;

finely adjusting a position of the chip on the transportation carrier by a fine-adjustment module; and bonding the adjusted chip to a substrate by a bonding module.

Further, the substrate may have a metallic, semiconductor or organic material.

Compared to the prior art, the present invention offers the following benefits:

In the chip bonding apparatus of the present invention, through transportation between the separation module and the bonding module, batch pickup-and-separation, batch transportation and batch chip-to-substrate bonding of chips are possible, resulting in a significant increase in chip bonding yield. Moreover, the control device can individually control the separation and bonding modules so that there is always at least one of these modules in operation, thus further enhancing chip bonding yield.

The chip bonding apparatus may further include at least one fine-adjustment module for finely adjusting the positions of the chip and hence effectively enhancing their bonding accuracy. Moreover, the transportation device incorporates multiple guide tracks on which respective transportation carriers are provided and defines separation, fine-adjustment and bonding areas through which the guide tracks traverse. Among the multiple guide tracks, the separation module travels in the separation area, the fine-adjustment module in the fine-adjustment area, and the bonding module in the bonding area. This imparts flexibility to the chip bonding process and further enhances its chip bonding yield, ensuring overall yield of the chip bonding apparatus and increasing its cost effectiveness.

Further, movement of the separation, fine-adjustment and bonding modules among the multiple linear guide tracks, on each of which, a corresponding transportation carrier travels forth and back under the control of the control device enables parallel transportation and bonding of chips, resulting in an additional improvement in chip bonding yield.

Alternatively, the annular guide track may be employed, on which a plurality of transportation carriers is arranged to allow serial transportation and bonding of chips. In such a configuration, the different modules in the chip bonding apparatus can operate simultaneously. In addition, at least one shunt loop may be provided on the annular guide track, each corresponding to one separation module, one fine-adjustment module or one bonding module, to further balance the process times of the pickup-and-separation, fine-adjustment and bonding steps. Coupled with optimization of the numbers of the separation, fine-adjustment and bonding modules, hybrid serial-parallel transportation and bonding of chips can be enabled to lead to a further improvement in chip bonding yield.

Furthermore, the separation mechanism in the separation area is able to move in multiple degrees of freedom under the control of the control device, thus facilitating the batch pickup-and-separation operation.

Lastly, the respective alignment systems in the fine-adjustment module, the bonding module and the transportation device in the chip bonding apparatus of the present invention can effectively increase chip bonding accuracy.

DETAILED DESCRIPTION OF PREFERRED EMBODIMENTS

Chip bonding apparatuses and methods according to the present invention will be described below in greater detail with reference to the accompanying flowcharts and schematics, which present preferred embodiments of the invention. It is to be appreciated that those skilled in the art can make changes to the invention disclosed herein while still obtaining the beneficial results thereof. Therefore, the following description shall be construed as being meant to be widely known by those skilled in the art rather than as limiting the invention.

The present invention will be further described in the following paragraphs by way of examples with reference to the accompanying drawings. Features and advantages of the invention will be more apparent from the following detailed description, and from the appended claims. Note that the accompanying drawings are provided in a very simplified form not necessarily presented to scale, with the only intention of facilitating convenience and clarity in explaining the embodiments.

The core concept of the present invention is to provide a chip bonding apparatus including:
at least one separation module for separating chips;
at least one bonding module for bonding the chips to a substrate;
a transportation device for transporting the chips between the separation module and the bonding module; and
a control device for individually controlling the separation module, the bonding module and the transportation device.

A corresponding chip bonding method using the chip bonding apparatus includes: picking up and separating the chips; and bonding the chips to the substrate.

In the chip bonding apparatus of the present invention, the transportation device is capable of transporting chips in batches between the separation module and the bonding module, enabling batch pickup and separation, batch transportation and batch chip-to-substrate bonding and thus a significant improvement in chip bonding yield. Moreover, individually controlling the separation module and the bonding module in the chip bonding apparatus with the control device can ensure that there is always at least one module in the chip bonding apparatus is in operation, resulting in an additional increase in chip bonding yield.

Embodiments of the chip bonding apparatus and method will be enumerated below in order for the present invention to be better understood. It is to be noted that the invention is not limited to the examples disclosed below and is intended to embrace all modifications made by those of ordinary skill in the art based on common general knowledge within its spirit and scope.

As used herein, the spatially relative terms "first direction", "second direction" and "third direction" are collectively defined as the "X direction", the "Y direction" and the "Z direction", respectively, for ease of description of the orientation of a movable device or feature as illustrated in the figures. In addition, spatially relative terms such as "above", "on" and the like, may be used herein to describe one device or feature's spatial relationship to another device(s) or feature(s). It is to be understood that the spatially relative terms are intended to encompass different orientations of the device in use or operation in addition to the orientation depicted in the figures.

Embodiment 1

Reference is now made to FIGS. 1 to 6, which respectively show a schematic front view of a chip bonding apparatus according to Embodiment 1 of the present invention, a schematic top view thereof, and schematic side views of various sections thereof.

Figure 1:
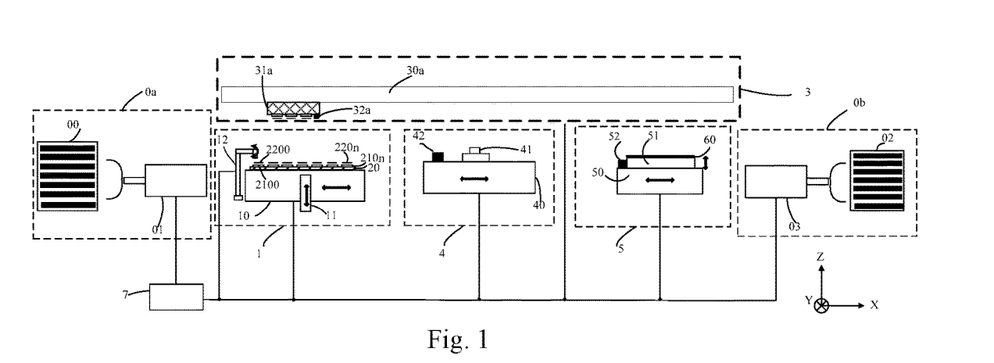
FIG. 1 is a schematic front view of a chip bonding apparatus according to Embodiment 1 of the present invention.

As shown in FIG. 1, the chip bonding apparatus according to this Embodiment includes a first material pick-up module 0a for storing chips. The first material pick-up module 0a includes a carrier cassette 00 in which several carriers 20 are placed and a first robotic arm 01 for picking up and transporting the carriers 20. Each of the carriers 20 carries a number of chips (e.g., chips 2100, . . . , 210n, where n is positive integer) and each of the chips is provided with a respective mark (e.g., 2200, . . . , 220n). The chip bonding apparatus further includes a second material pick-up module 0b including a substrate cassette 02 containing several substrates 60 and a second robotic arm 03 for picking up and transporting the substrates 60. The substrates 60 include blank substrates to which chips are to be bonded and processed substrates to which chips have been be bonded. Each of the substrates 60 may be a metallic, semiconductor or organic material.

The chip bonding apparatus further includes a transportation device 3. The transportation device 3 includes at least one guide track and at least one transportation carrier for carrying chips. Each guide track is provided with at least one transportation carrier. Preferably, in this Embodiment, as shown in the schematic top view of the chip bonding apparatus of FIG. 2, the transportation device 3 includes three linear guide tracks (i.e., a first linear guide track 30a, a second linear guide track 30b and a third linear guide track 30c), each provided with a respective transportation carrier. Each of the transportation carriers has a carrier plate (31a, 31b, 31c) and an alignment system (32a, 32b, 32c). The carrier plate (31a, 31b, 31c) is fixed to a corresponding alignment system (32a, 32b, 32c). The carrier plate (31a, 31b, 31c) is configured to carry chips, while the alignment system (32a, 32b, 32c) is adapted to detect positions of chips on the carriers 20 and marks on the substrates 60. The carrier plate (31a, 31b, 31c) can be controlled to move forth and back with the alignment system (32a, 32b, 32c) on the corresponding linear guide track (30a, 30b, 30c).

Figure 2:
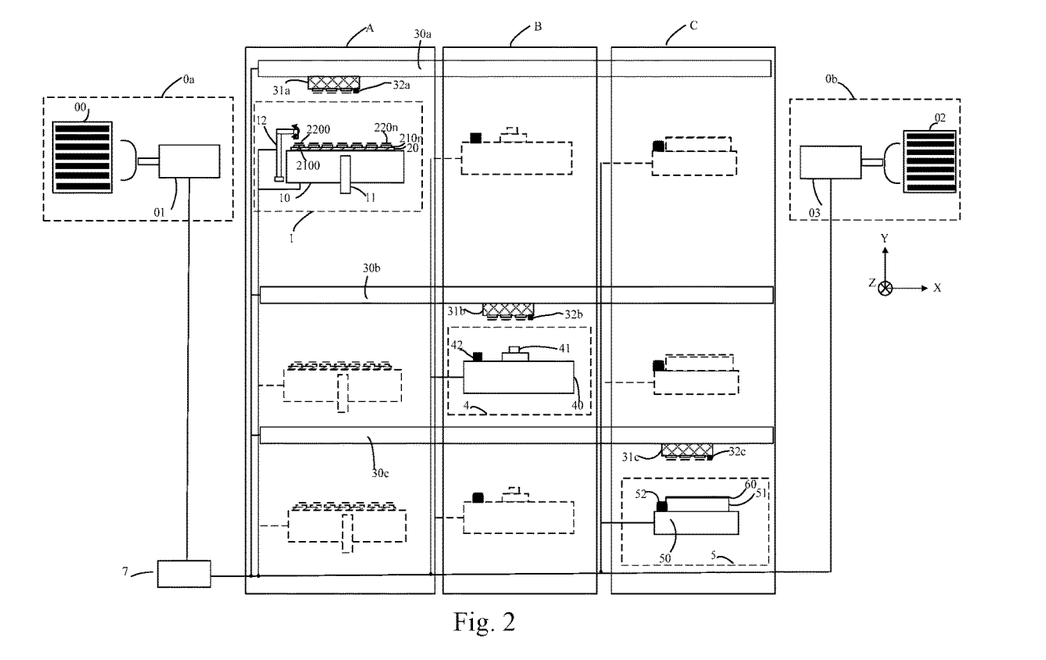
FIG. 2 is a schematic top view of the chip bonding apparatus according to Embodiment 1 of the present invention.
Figure 3:
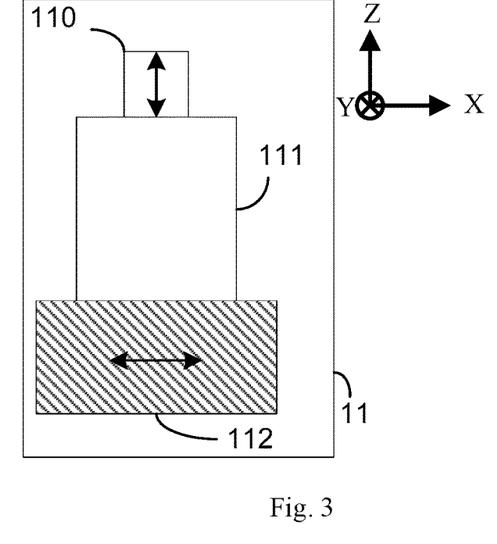
FIG. 3 is a structural schematic of a separation mechanism in the chip bonding apparatus according to Embodiment 1 of the present invention.
Figure 4:
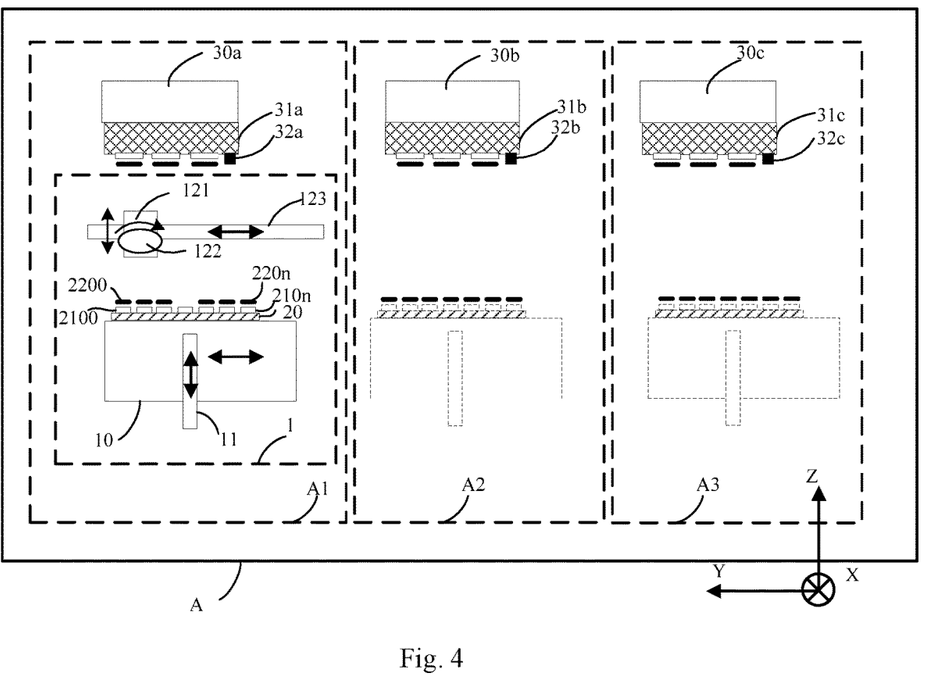
FIG. 4 is a schematic side view of a separation area in the chip bonding apparatus according to Embodiment 1 of the present invention.

The chip bonding apparatus further includes a separation module 1 including: a separation table 10 for supporting the carrier 20; a separation mechanism 11 for separating chips; and a flipping robotic arm 12 for picking up and flipping the chips. Preferably, the separation table 10 is moveable both in the X direction (i.e., the first direction) and in the Y direction (i.e., the second direction). As shown in FIGS. 1, 2 and 4 (FIG. 4 is a side view of a separation area A of the chip bonding apparatus), the separation area A may be divided, based on a distribution of the three linear tracks (30a, 30b, 30c), into a first separation zone A1, a second separation zone A2 and a third separation zone A3. The movability of the separation table 10 in the Y direction (the dashed line boxes in FIG. 4 indicate positions where the separation table 10 of the separation module 1 will stay during its movement) means that the separation module 1 can move between the separation zones A1, A2 and A3 to perform chip picking up and separating operations on the three linear guide tracks (30a, 30b, 30c). As noted above, the separation table 10 is also movable in the X direction, in order to transport the carrier 20 supported thereon under the flipping robotic arm 12, so that the flipping robotic arm 12 may flip the individual chips and place the chips onto the carrier plate of the transportation carrier (31a, 31b or 31c). As shown in FIG. 3, the separation mechanism 11 includes, from the top downward: a separation pin 110 movable in the Z direction (i.e., the third direction) so as to lift a single chip from the surface of the overlying carrier 20, which is then sucked up onto the flipping robotic arm 12; a suction member 111, the suction member 111 is configured to retain the carrier 20 by suction so as to allow the flipping robotic arm 12 to suck up the individual chips thereon; and a horizontal mover 112. The separation pin 110 and the suction member 111 are fixed on the horizontal mover 112. The horizontal mover 112 can travel in both the X and Y directions. After a single chip (e.g., 2100) has been sucked up and flipped by the flipping robotic arm 12, i.e., having experienced a pickup-and-separation process. The horizontal mover 112 is controlled to move with the suction member 111 and the separation pin 110 in the X or Y direction to the next "target". That is, the separation mechanism 11 will move under another single chip to be subsequently picked up and separated (the movement of the horizontal mover 112 depends on how the chips are arranged on the carrier 20. For example, for ease of control, the chips may be arranged into one row, so that all of them can be picked up and separated simply with unidirectional movement of the horizontal mover 112 in the X or Y direction). As shown in FIG. 4, the flipping robotic arm 12 includes a Z-directional mover 121, a Y-directional mover 123 and a rotator 122.

Figure 5:
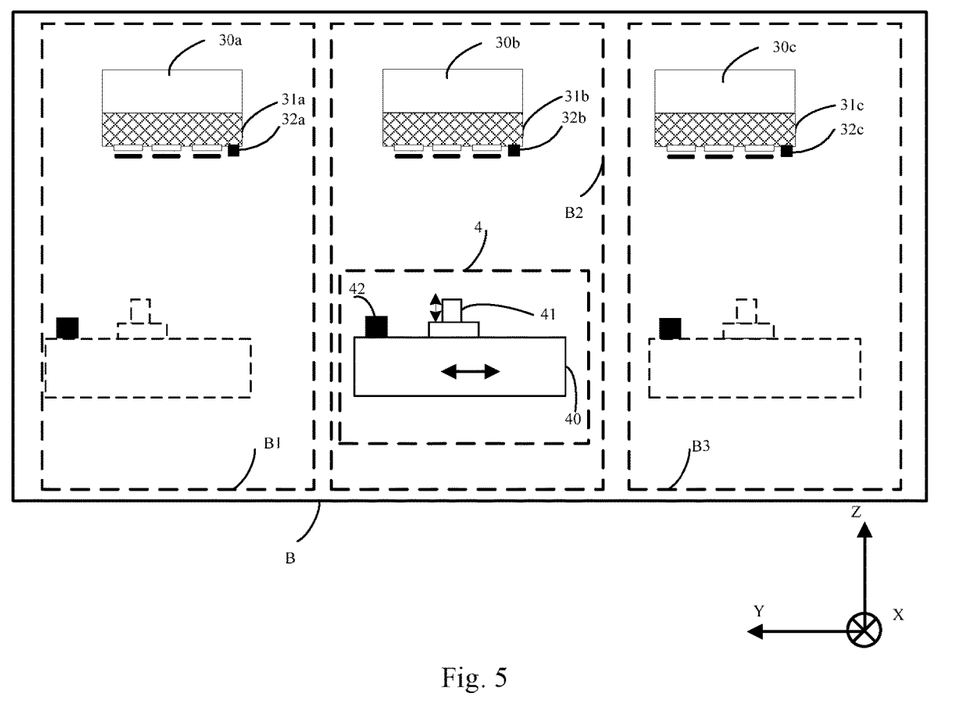
FIG. 5 is a schematic side view of a fine-adjustment area in the chip bonding apparatus according to Embodiment 1 of the present invention.

The chip bonding apparatus further includes a fine-adjustment module 4. After undergoing the pickup-and-separation process in the separation area A, the separated chips on the carrier plate (31a, 31b or 31c) are transported by the transportation device 3 into a fine-adjustment area B where their positions will be finely adjusted. As shown in FIGS. 1, 2 and 5, the fine-adjustment module 4 includes: a fine-adjustment table 40 for assisting the adjustment of the chips; a pin 41 disposed on the fine-adjustment table 40 and adapted to adjust the positions of the chips; and an alignment system 42 for detecting the positions of the chips (for ease of description, the alignment system 42 is referred hereinafter as the second alignment system 42). The fine-adjustment table 40 can move in both the X and Y directions. Similarly, the fine-adjustment area B is also divided into a first fine-adjustment zone B1, a second fine-adjustment zone B2 and a third fine-adjustment zone B3, in which the fine-adjustment module operates to finely adjust the positions of the chips on one of the multiple linear guide tracks (30a, 30b, 31c). The pin 41 can move up and down to facilitate chip suction and handover in the Z direction.

Figure 6:
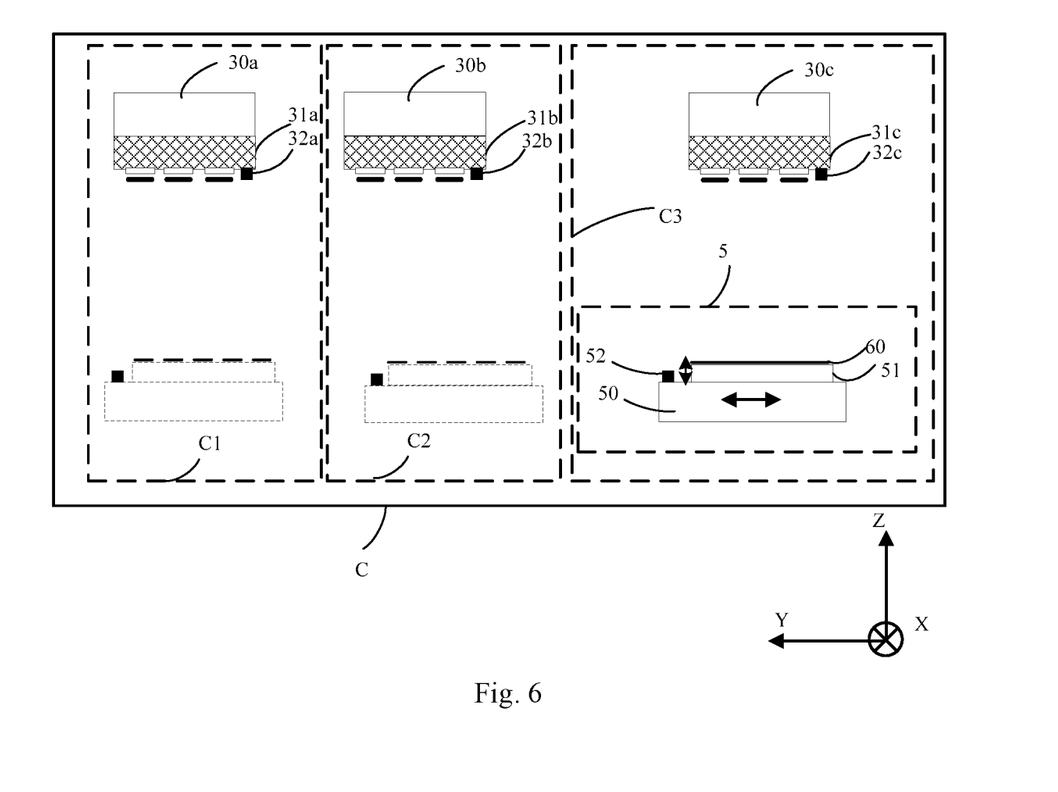
FIG. 6 is a schematic side view of a bonding area in the chip bonding apparatus according to Embodiment 1 of the present invention.

The chip bonding apparatus further includes a bonding module 5. After the positions of the chips have been finely adjusted in the fine-adjustment area B, the chips are carried on the carrier plate (31a, 31b or 31c) and transported by the transportation device 3 into a bonding area C. As shown in FIGS. 1, 2 and 6, the bonding module 5 includes a bonding table 50 for supporting a substrate 60 and an alignment system 52 for detecting the positions of the chips (for ease of description, the alignment system 52 is referred hereinafter as the third alignment system 52). Preferably, the bonding table 50 is movable in both the X and Y directions. Similarly, the bonding area C is divided into a first bonding zone C1, a second bonding zone C2 and a third bonding zone C3, in which the bonding module 5 operates to bond a substrate to the chips on one of the linear guide tracks (30a, 30b, 31c). In this Embodiment, the bonding table 50 is further provided with a presser 51. The presser 51 is movable in the Z direction to raise the substrate 60 and bond it to the chips. Of course, if the bonding table 50 itself is configured to be movable in the Z direction, the presser 51 may be omitted. In this case, the bonding table 50 accomplishes the function of the presser.

The chip bonding apparatus further includes a control device 7. The control device 7 is configured for individually controlling the various modules as well as the transportation device 3 as defined above.

Considering the guide tracks in the transportation device 3 are linear ones in this Embodiment, the separation module 1, the fine-adjustment module 4 and the bonding module 5 may be arranged to be parallel to one another, in order to facilitate the process operations.

In order for this Embodiment to be better understood, a chip bonding method using the above chip bonding apparatus will be described in detail below.

Figure 7:
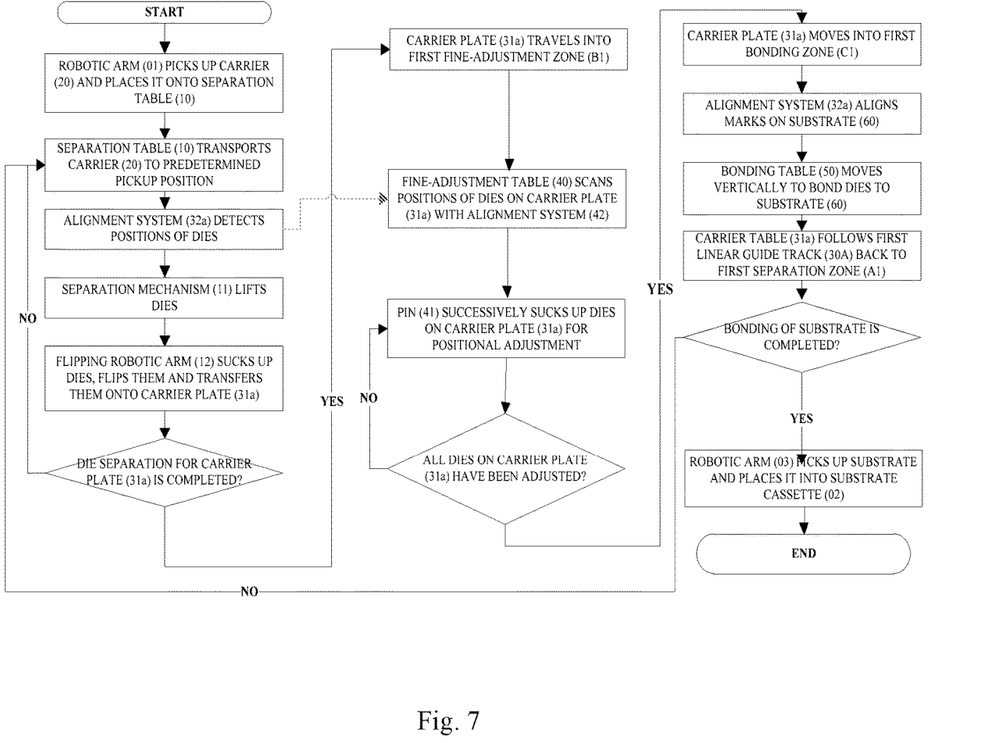
FIG. 7 is a flowchart of a chip bonding method using the chip bonding apparatus according to Embodiment 1 of the present invention.

Referring to FIG. 7, a flowchart of a process for transporting and bonding chips on the first linear guide track 30a. The chip bonding method includes the steps of (here, it is assumed that the process begins with all the transportation carriers situated at the start positions of the respective linear guide tracks and with the separation module 1, the fine-adjustment module 4 and the bonding module 5 arranged in parallel to one another with respect to the direction in which the first linear guide track 30a extends, i.e., with the separation module 1 located in the first separation zone A1, the fine-adjustment module 4 in the first fine-adjustment zone B1 and the bonding module 5 in the first bonding zone C1):

start of the process; and pickup of chips, wherein the first robotic arm 01 is dictated by the control device 7 to take out a carrier 20 from the carrier cassette 00 and place it onto the separation table 10. The carrier 20 supports a number of chips (e.g., 2100, . . . , 210n), each of the chips is provided thereon with a mark (2200, . . . , 220n).

A chip pickup-and-separation process is then performed on the carrier plate 31a in the first separation zone A1.

The separation table 10 transports the carrier 20 under the flipping robotic arm 12. The separation mechanism 11 then lifts one of the chips (e.g., 2100). The carrier plate 31a follows the first linear guide track 30a to move with the alignment system 32a to a position over the carrier 20 suitable for receiving the single chip (e.g., 2100). The alignment system 32a scans the mark 2200 on the chip 2100 and makes a decision about the status of the mark 2200. If the mark 2200 is defective or the chip is absent, the carrier plate 310a and the separation mechanism 11 will responsively moves to respective positions corresponding to another chip. When this chip meets the pickup criteria, the position of the alignment system 32a will be adjusted by the carrier plate 31a so that it is aligned with the mark 2200 on the chip 2100. The flipping robotic arm 12 then sucks up the chip, flips it and transfers it onto the carrier plate 31a. This process is repeated until a predetermined number of chips have been loaded on the carrier plate 31a in a predetermined pattern.

A fine-adjustment process is then performed on the chips on the carrier plate 31a in the first fine-adjustment zone B1. At the same time, the separation module 1 moves into the second separation zone A2 to perform another chip pickup-and-separation process on the carrier plate 31b.

Under the control of the control device 7, the carrier plate 31a transports the alignment system 32a on the first linear guide track 30a from the first separation zone A1 into a fine-adjustment station in the first fine-adjustment zone B1, where the second alignment system 42 on the fine-adjustment table 40 scans all of the chips on the carrier plate 31a to obtain their positional information. Subsequently, the pin 42 extends upward to retain one of the chips in need of such adjustment. Then the pin 42 retracts down to the original position, followed by movement of the fine-adjustment table 40 with the pin 42 for the chip to be positioned correctly. After that, the pin 42 again extends upward to return the chip back onto the carrier plate 31a. This process is repeated until all the chips on the carrier plate 31a in need of such fine-adjustment have been so processed.

At the same time, after the pickup-and-separation process in the first separation zone A1 is completed, the separation module 1 is controlled by the control device 7 to travel along the Y direction into the second separation zone A2, where it repeats the actions taken in the first separation zone A1 to fulfill another chip pickup-and-separation process on the carrier plate 31b for the second linear track 30b.

A chip-to-substrate bonding process is then performed on the chips on the carrier plate 31a in the first bonding zone C1. At the same time, the separation module 1 moves into the third separation zone A3 to perform a further chip pickup-and-separation process on the carrier plate 31c. The fine-adjustment module 4 moves into the second fine-adjustment zone B2 to carry out another fine-adjustment process for the carrier plate 31b.

Under the control of the control device 7, the carrier plate 31a carries the alignment system 32a to move on the first linear guide track 30a from the first fine-adjustment zone B1 into a bonding station in the first bonding zone C1, wherein a substrate 60 to which the chips to be bonded has got ready. The substrate 60 may be a metallic, semiconductor or organic material. The alignment system 32a effectuates alignment with marks on the substrate 60, with the aid of the third alignment system 52 on the bonding table 50 for detecting the positions of the chips on the carrier plate 32a. The presser 51 on the bonding table 50 then moves straight upward to bond the substrate 60 to the chips on the carrier plate 31a.

After the chips on the carrier plate 31a have been bonded to the substrate, the carrier plate 31a travels with the alignment system 32a along the first linear guide track 30a back to its initial position and gets ready for the next chip bonding cycle.

At the same time, the carrier plate 31b moves along the second linear guide track 30b from the second separation zone A2 into the second fine-adjustment zone B2, concurrently with the fine-adjustment module 4 travelling from the first fine-adjustment zone B1 into the second fine-adjustment zone B2, wherein the same actions taken in the first fine-adjustment zone B1 are repeated to finely adjust the positions of the chips on the carrier plate 31b.

Further, at the same time, the separation module 1 travels from the second separation zone A2 into the third separation zone A3, where it repeats the previous actions to perform a chip pickup-and-separation process on the carrier plate 31c on the third linear track 30c.

As such, the separation module 1, the fine-adjustment module 4 and the bonding module 5 regularly move forth and back among the three linear guide tracks to bond chips onto substrates.

At the end of the process, the processed substrate 60 is stored.

After the completion of the bonding process for the substrate 60, the second robotic arm 03 is controlled by the control device 7 to pick up the substrate 60 and place the substrate 60 into the substrate cassette 02.

In the chip bonding apparatus according to this Embodiment, the three linear guide tracks (30a, 30b, 30c) are employed as transportation guide ways, and the three carrier plates (31a, 31b, 31c) provided on the respective linear guide tracks operate in parallel to one another under the coordination of the control device 7. After the carrier plate 31a has completed a chip pickup-and-separation process, the separation module 1 travels under the second linear guide track 30b to carry out another pickup-and-separation process for the carrier plate 31b. The separation module 1 then further moves under the third linear guide track 30c to carry out the chip pickup-and-separation process for the carrier plate 31c. Similarly, the fine-adjustment module 4 and the bonding module 5 also move forth and back among the three linear guide tracks. Therefore, the chip bonding apparatus is capable of parallel batch pickup-and-separation, batch transportation and batch bonding operations, and it is ensured that there is always at least one of the modules in operation (as shown in FIG. 4) in each of the areas (separation area A, the fine-adjustment area B and the bonding area C). This results in improved chip bonding yield.

Embodiment 2

Figure 8:
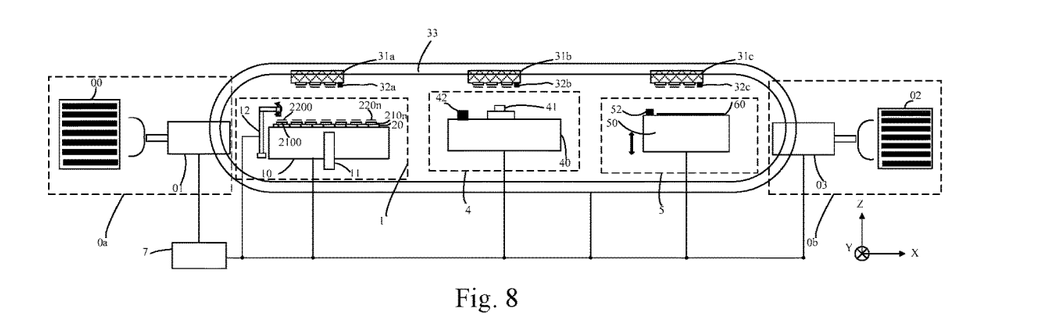
FIG. 8 is a schematic front view of a chip bonding apparatus according to Embodiment 2 of the present invention.
Figure 9:
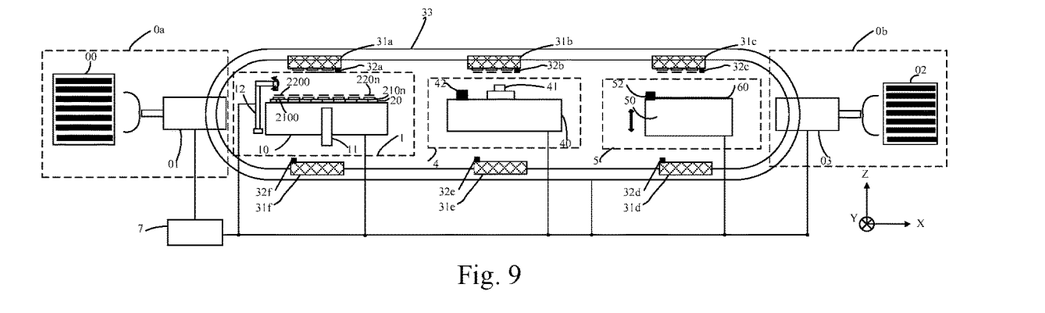
FIG. 9 is a schematic front view of another chip bonding apparatus according to Embodiment 2 of the present invention.
Figure 10:
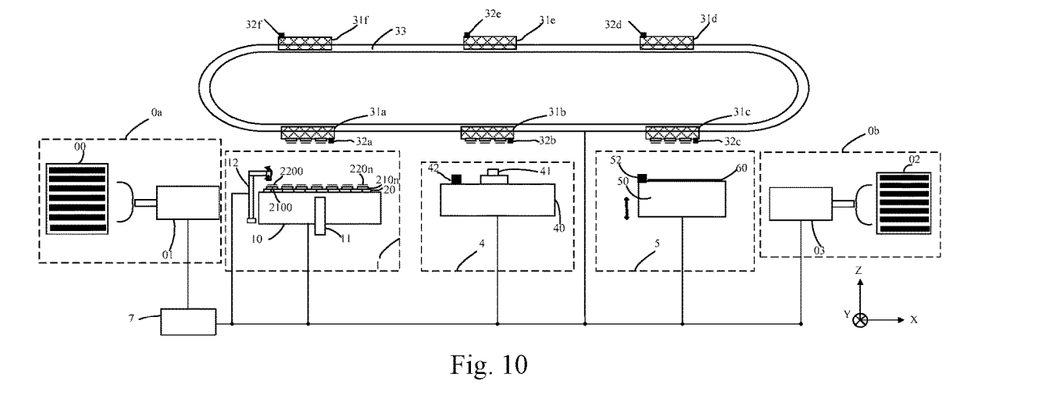
FIG. 10 is a schematic front view of still another chip bonding apparatus according to Embodiment 2 of the present invention.

Reference is now made to FIGS. 8, 9 and 10, in which the reference numerals identical to those in FIGS. 1 to 6 indicate the same elements as in these figures. A chip bonding apparatus according to Embodiment 2 differs from that of Embodiment 1 in that the transportation device includes two guide tracks which are connected end to end to form an annular guide track 33. In order for improved chip bonding yield to be achieved, several transportation carriers are arranged on the annular guide track 33. As shown in FIG. 8, three transportation carriers may be provided on the guide track 33, each including a carrier plate and an alignment system. For example, disposed on the guide track 33 may be a first carrier plate 31a and a first alignment system 32a, a second carrier plate 31b and a second alignment system 32b, as well as a third carrier plate 31c and a third alignment system 32c. In order to further enhance the chip bonding capacity, preferably, as shown in FIGS. 9 and 10, six transportation carriers may be arranged on the guide track 33. For example, a fourth carrier plate 31d, a fourth alignment system 32d, a fifth carrier plate 31e, a fifth alignment system 32e, a sixth carrier plate 31f and a sixth alignment system 32f may be additionally provided. Of course, the present invention is not limited to three or six carrier plate/alignment system sets, and a suitable number of such sets may be selected based on practical production needs. The guide track 33 is disposed above the separation module 1, the fine-adjustment module 4 and the bonding module 5, either in a horizontal configuration as shown in FIG. 9, or in a vertical configuration as shown in FIG. 10. Additionally, in Embodiment 2, the bonding table 50 may be configured to be movable in the Z direction, meaning that the presser 51 in Embodiment 1 is omitted here. The separation module 1, the fine-adjustment module 4 and the bonding module 5 may be arranged, depending on the annular guide track, for example without limitation, either parallel to one another or into an annular configuration.

The chip bonding method using the chip bonding apparatus according to this Embodiment resembles a "flow-line" process, because the multiple transportation carriers under the control of the control device 7 are "pipelined" along the guide track 33. In other words, the separation module 1, the fine-adjustment module 4 and the bonding module 5 can operate simultaneously. For example, after undergoing a pickup-and-separation process, the first carrier plate 31a may be "pipelined" (moved) along the guide track 33 down to above the fine-adjustment module 4 to receive a fine-adjustment process (i.e., a "downstream station") for the first carrier plate 31a. At this point, the third carrier plate 31c or the sixth carrier plate 31f moves above the separation module 1 which then performs another pickup-and-separation process thereon. In this way, the orderly movement of the carriers on the guide track 33 entails a "flow-line" chip bonding approach. Of course, in case of multiple separation modules, multiple fine-adjustment modules and multiple bonding modules being employed, in order to achieve simultaneous operation of them, the quantities of the respective types of modules may be optimized based on the process times of the various steps in the chip bonding method (i.e., pickup-and-separation, fine-adjustment and bonding). For example, assuming the process steps performed by the separation, fine-adjustment and bonding modules cost a, b and c seconds, letting d represent the least common multiple of 1, m and n, which are the rounded results 3600/a, 3600/b and 3600/c, respectively. Then the numbers of the separation modules, the fine-adjustment modules and the bonding modules may be d/a, d/b and d/c, respectively. The rounding results may be obtained using either an up-rounding function Ceil(x) or a down-rounding function Floor(x). The up-rounding function Ceil(x) returns the smallest integer not less than x, while the down-rounding function Floor(x) returns the largest integer not greater than x.

In the chip bonding apparatus according to this Embodiment, the multiple transportation carriers arranged on the annulus formed by putting together two guide tracks are capable of serial transportation and bonding operations. Moreover, the numbers of the separation modules, the fine-adjustment modules and the bonding modules can be optimized to achieve simultaneous operation of these modules, resulting in an improvement in chip bonding yield.

Embodiment 3

Since the process steps (i.e., pickup-and-separation, fine-adjustment and bonding) in the chip bonding method takes different times, the yield of the chip bonding apparatus in Embodiment 2 is restricted by the longest process step. In order to further enhance the yield of the chip bonding apparatus, the chip bonding apparatus may be further optimized.

Figure 11:
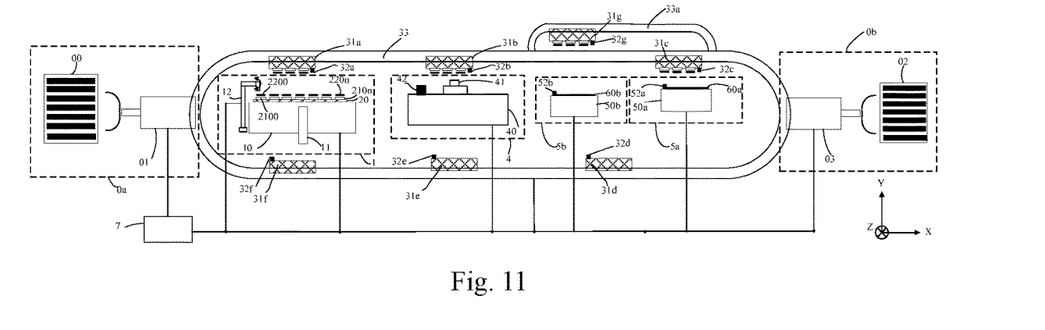
FIG. 11 is a schematic front view of a chip bonding apparatus according to Embodiment 3 of the present invention.

Referring to FIG. 11, in which the reference numerals identical to those in FIGS. 8, 9 and 10 indicate the same elements as in these figures. A chip bonding apparatus according to Embodiment 3 differs from that of Embodiment 2 in that the guide track 33 of the transportation device is provided with at least one shunt loop each corresponding to one separation module, one fine-adjustment module or one bonding module. In order to more clearly explain this Embodiment, it is assumed that, in the chip bonding method, the pickup-and-separation step lasts for 15 s, fine-adjustment step lasts for 15 s and chip-to-substrate bonding step lasts for 30 s. As shown in FIG. 11, a shunt loop 33a is provided on the guide track 33 in positional correspondence with an underlying first bonding module 5a (including a first bonding table 50a, a first third alignment system 52a and a first substrate 60a). Correspondingly, in order to "shunt" a corresponding transportation carrier (e.g., a seventh transportation carrier including a seventh carrier plate 31g and a seventh alignment system 32g) by a second bonding module 5b (including a second bonding table 50b, a second third alignment system 52b and a second substrate 60b) disposed within the shunt loop 33a. Therefore, based on the process times of the different steps, the numbers of the separation modules, the fine-adjustment modules and the bonding modules, as well as the shunt loop(s), can be further optimized. This will be readily devisable by those of ordinary skill in the art, and thus will not be described in greater detail for the sake of simplicity. The chip bonding method of the chip bonding apparatus in Embodiment 3 is similar to that of Embodiment 2, except additional involvement of parallel transportation. This will be readily devisable by those of ordinary skill in the art, and thus will not be described in greater detail for the sake of simplicity.

According to this Embodiment, additionally providing the at least one shunt loop on the annular guide track, each corresponding to one separation module, fine-adjustment module or bonding module, allows hybrid parallel-serial operations in the chip bonding method implemented by the chip bonding apparatus. As a result, the productivity of the chip bonding apparatus is maximized and optimized, further augmenting chip bonding yield.

In summary, in the chip bonding apparatus of the present invention, through transportation among the separation module, the fine-adjustment module and the bonding module, batch pickup-and-separation, batch transportation and batch bonding of chips are possible, resulting in a significant increase in chip bonding yield. Moreover, the control device can individually control the separation module, the fine-adjustment module and the bonding module so that there is always at least one of these modules in operation, thus further enhancing chip bonding yield.

Additionally, the transportation device incorporates multiple guide tracks on which respective transportation carriers are provided and defines separation area, fine-adjustment area and bonding area through which the guide track traverses. Among the multiple guide tracks, the separation module travels in the separation area, the fine-adjustment module in the fine-adjustment area, and the bonding module in the bonding area. This imparts flexibility to the chip bonding process and further enhances its chip bonding yield, ensuring overall yield of the chip bonding apparatus and increasing its cost effectiveness.

Further, movement of the separation, fine-adjustment and bonding modules among the multiple linear guide tracks, on each of which, a corresponding transportation carrier travels forth and back under the control of the control device enables parallel transportation and bonding of chips, resulting in an additional improvement in chip bonding yield.

The alternative embodiment employing the annular guide track on which a plurality of transportation carriers is arranged to allow serial transportation and bonding of chips. In this case, the yield of the apparatus is determined by the longest process step. In order to further enhance the yield, a multi-area configuration may be adopted, in which assuming the steps performed by the separation, fine-adjustment and bonding modules lasts for durations of a, b and c, respectively, letting d being the least common multiple of 1, m and n, which are the rounded results 3600/a, 3600/b and 3600/c, respectively, it is theoretically optimal to deploy d/a separation modules in the separation area, d/b fine-adjustment modules in the fine-adjustment area and d/c bonding modules in the bonding area. In such a configuration, the different modules in the chip bonding apparatus can operate simultaneously. In addition, at least one shunt loop may be provided on the annular guide track, each corresponding to one separation module, one fine-adjustment module or one bonding module, to further balance the process times of the pickup-and-separation, fine-adjustment and bonding steps. Coupled with optimization of the numbers of the separation, fine-adjustment and bonding modules, hybrid serial-parallel transportation and bonding of chips can be enabled to lead to a further improvement in chip bonding yield.

Furthermore, the separation mechanism in the separation area is able to move in multiple degrees of freedom under the control of the control device, thus facilitating the batch pickup-and-separation operation.

Lastly, the respective alignment systems in the fine-adjustment module, the bonding module and the transportation device in the chip bonding apparatus of the present invention can effectively increase chip bonding accuracy.

It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A chip bonding apparatus, comprising:
   at least one separation module for separating chips;
   at least one bonding module for bonding the chips to a substrate;
   a transportation device for transporting the chips between the separation module and the bonding module, the transportation device comprising one or more guide tracks and one or more transportation carriers for retaining the chips, wherein each of the guide tracks is provided thereon with at least one of the transportation carriers;
   a control device for individually controlling the separation module, the bonding module and the transportation device; and
   at least one fine-adjustment module for finely adjusting positions of the chips carried on the transportation carriers,
   wherein the transportation device is configured to transport the chips among the separation module, the fine-adjustment module and the bonding module, and wherein the control device is further configured to control the fine-adjustment module.

2. The chip bonding apparatus of claim 1, wherein the transportation device comprises a plurality of guide tracks extending in a direction along which a separation area, a fine-adjustment area and a bonding area are defined.

3. The chip bonding apparatus of claim 2, wherein the plurality of guide tracks are linear guide tracks, the separation module moves within the separation area among the plurality of guide tracks, the fine-adjustment module moves within the fine-adjustment area among the plurality of guide tracks, and the bonding module moves within the bonding area among the plurality of guide tracks.

4. The chip bonding apparatus of claim 3, wherein each of the linear guides is provided thereon with one of the transportation carriers, the control device controls the transportation carriers to move forth and back on the linear guide tracks, such that the transportation carriers on at least two of the linear guide tracks are located within different ones of the separation area, the fine-adjustment area and the bonding area and operate in cooperation with the corresponding ones of the separation module, the fine-adjustment module and the bonding module.

5. The chip bonding apparatus of claim 2, wherein the transportation device comprises two guide tracks which are connected end to end to form an annular guide track.

6. The chip bonding apparatus of claim 5, wherein a number of transportation carriers are provided on the annular guide track, the control device controls the transportation carriers to move orderly on the annular guide track, such that at least two of the transportation carriers are located within different ones of the separation area, the fine-adjustment area and the bonding area and operate in cooperation with the corresponding ones of the separation module, the fine-adjustment module and the bonding module.

7. The chip bonding apparatus of claim 6, wherein operations performed by the separation module, the fine-adjustment module and the bonding module last for durations of a, b and c seconds, respectively, letting d represent the least common multiple of l, m and n, which are rounded results of 3600/a, 3600/b and 3600/c, respectively, numbers of the at least one separation module, the at least one fine-adjustment module and the at least one bonding module are set as d/l, d/m and d/n, respectively.

8. The chip bonding apparatus of claim 5, wherein at least one shunt loop is provided on the annular guide track, each shunt loop corresponds to one of the at least one separation module, one of the at least one fine-adjustment module or one of the at least one bonding module.

9. The chip bonding apparatus of claim 1, wherein each of the transportation carriers comprises a carrier plate and an alignment system, the carrier plate is configured to carry the chip, the alignment system is configured to detect a position of the chip to be separated as well as a mark on the substrate.

10. The chip bonding apparatus of claim 1, wherein the separation module comprises:
    a separation table for supporting the chips;
    a flipping robotic arm for picking up and flipping the chips; and
    a separation mechanism which is disposed in the separation table and is configured to separate the chips.

11. The chip bonding apparatus of claim 10, wherein the separation mechanism comprises, from a top downward, a separation pin, a suction member and a horizontal mover, the separation pin and the suction member are both fixed on the horizontal mover, the horizontal mover have two degrees of freedom of movement in a first direction and a second direction, the separation pin is movable and has one degree of freedom of movement in a third direction, the first, second and third directions are perpendicular to one another.

12. The chip bonding apparatus of claim 10, wherein the flipping robotic arm has three degrees of freedom of movement in a first direction, a second direction and a third direction and one degree of freedom of rotation, the first, second and third directions are perpendicular to one another.

13. The chip bonding apparatus of claim 1, wherein the fine-adjustment module comprises a fine-adjustment table as well as an alignment system and a pin disposed on the fine-adjustment table, the alignment system is configured to detect the positions of the chips, the pin configured to adjust the positions of the chips.

14. The chip bonding apparatus of claim 1, wherein the bonding module comprises: a bonding table for supporting the substrate; and an alignment system for detecting the positions of the chips.

15. The chip bonding apparatus of claim 14, wherein the bonding table has three degrees of freedom of movement in a first direction, a second direction and a third direction, the first, second and third directions are perpendicular to one another.

16. The chip bonding apparatus of claim 14, wherein the bonding table has two degrees of freedom of movement in a first direction and a second direction, and a presser is disposed on the bonding table, the presser has one degree of freedom of movement in a third direction, the first, second and third directions perpendicular to one another.

17. The chip bonding apparatus of claim 1, further comprising a first material pick-up module for storing chips and a second material pick-up module for storing substrates, the first material pick-up module comprising: a carrier cassette containing a plurality of carriers; and a first robotic arm for picking up and transporting the carriers, each carrier bearing a number of the chips, the second material pick-up module comprising: a substrate cassette for storing substrates; and a second robotic arm for picking up and transporting the substrates.

18. A chip bonding method using the chip bonding apparatus of claim 1, the chip bonding method comprising:

picking up and separating chips by the at least one separation module and carrying the separated chip by the one or more transportation carriers of a transportation device;

finely adjusting a position of the chip on the transportation carrier by the at least one fine-adjustment module; and bonding the adjusted chip to the substrate by the at least one bonding module.

19. The chip bonding method of claim 18, wherein the substrate has a metallic, semiconductor or organic material.

* * * * *